United States Patent
Kim

(10) Patent No.: US 7,638,422 B2
(45) Date of Patent: Dec. 29, 2009

(54) METHOD OF MANUFACTURING METAL INSULATING LAYER IN SEMICONDUCTOR DEVICE

(75) Inventor: Hee Dae Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 376 days.

(21) Appl. No.: 11/616,760

(22) Filed: Dec. 27, 2006

(65) Prior Publication Data

US 2007/0148957 A1 Jun. 28, 2007

(30) Foreign Application Priority Data

Dec. 28, 2005 (KR) .................. 10-2005-0131502

(51) Int. Cl.
*H01L 21/4763* (2006.01)

(52) U.S. Cl. .................. 438/622; 438/618; 438/625; 438/637; 438/672

(58) Field of Classification Search ......... 438/618–625, 438/637–638, 672–670, 700
See application file for complete search history.

(56) References Cited

U.S. PATENT DOCUMENTS

| | | | | |
|---|---|---|---|---|
| 5,162,261 A | * | 11/1992 | Fuller et al. | 438/640 |
| 5,494,854 A | * | 2/1996 | Jain | 438/692 |
| 6,211,040 B1 | * | 4/2001 | Liu et al. | 438/424 |
| 2003/0008492 A1 | * | 1/2003 | Jung et al. | 438/624 |
| 2006/0022343 A1 | * | 2/2006 | Lin et al. | 257/758 |

* cited by examiner

*Primary Examiner*—Dung A. Le
(74) *Attorney, Agent, or Firm*—Sherr & Vaughn, PLLC

(57) ABSTRACT

A method of forming a metal insulating layer of a semiconductor device relieves stress due to differential thermal expansion between insulating sub-layers by rounding off sharp edges formed between the sub-layers. A first metal insulating sub-layer is formed over a metal interconnection layer pattern. The first metal insulating sub-layer has sharp profiles due to a step height difference in the metal interconnection layer pattern. The first metal insulating sub-layer is wet etched to round off the sharp profiles. A second metal insulating sub-layer is formed over the first metal insulating sub-layer.

6 Claims, 3 Drawing Sheets

METHOD OF MANUFACTURING METAL INSULATING LAYER IN SEMICONDUCTOR DEVICE

The present application claims priority under 35 U.S.C. 119 and 35 U.S.C. 365 to Korean Patent Application No. 10-2005-0131502 (filed on Dec. 28, 2005), which is hereby incorporated by reference in its entirety.

BACKGROUND

FIG. 1 is a sectional view illustrating a method of forming a metal insulating layer of a related semiconductor device and its problems.

Referring to FIG. 1, a metal interconnection layer pattern 120 exposes a part of the insulating layer 110 formed over a semiconductor substrate 100. A first metal insulating sub-layer 131 and a second metal insulating sub-layer 132 are sequentially laminated over the exposed surface of the insulating layer 110 and the metal interconnection layer pattern to form a metal insulating layer 130. The first metal insulating sub-layer 131 is formed of a high density plasma (HDP) oxide layer having a high gap filling performance. The second metal insulating sub-layer 132 is formed of a plasma enhanced-tetra ethyl ortho silicate (PE-TEOS) oxide layer. A first protective insulation sub-layer 141 for protecting a metal insulating layer and a chip and a second protective insulating sub-layer 142 are deposited over the metal insulating layer to form a protective insulating layer 140. The first protective insulating sub-layer 141 is an oxide layer and a second protective insulating sub-layer 142 is a nitride layer.

In the related method of forming the metal insulating layer, the first metal insulating sub-layer 131 is formed by repeating deposition and etching. Due to the step difference caused by the metal interconnection layer pattern 120, the top edges of the first metal insulating sub-layer 131 have sharp profiles as denoted by A in the drawing. Therefore, stress is caused by differing thermal expansion coefficients of the metal interconnection layer pattern 120 and the insulating layers in a subsequent thermal process. The stress can cause severe problems in the boundaries between the insulating layers because the top edges of the first metal insulating sub-layer 131 are sharp. As an example, when the thermally-induced stress reaches a threshold value, the top edges of the first metal insulating sub-layer 131 are cracked. In a severe example, the protective insulating layer 140 is also cracked so that the reliability of a device is significantly degraded.

SUMMARY

Embodiments relate to a method of forming a metal insulating layer of a semiconductor device, in which stress caused by the difference in the thermal expansion coefficients between a metal interconnection layer pattern and insulating layers can be attenuated, so that it is possible to prevent the insulating layers from cracking.

Embodiments relate to a method of forming a metal insulating layer of a semiconductor device. A first metal insulating sub-layer is formed over a metal interconnection layer pattern. The first metal insulating sub-layer has sharp profiles due to a step height difference in the metal interconnection layer pattern. The first metal insulating sub-layer is wet etched to round off the sharp profiles. A second metal insulating sub-layer is formed over the first metal insulating sub-layer.

The first metal insulating sub-layer may be formed of an HDP oxide layer.

The second metal insulating sub-layer may be formed of a PE-TEOS oxide layer.

A protective insulating layer including an oxide sub-layer and a nitride sub-layer may be formed over the second metal insulating sub-layer.

BRIEF DESCRIPTION OF DRAWINGS

Example

DETAILED DESCRIPTION

Figure 1:
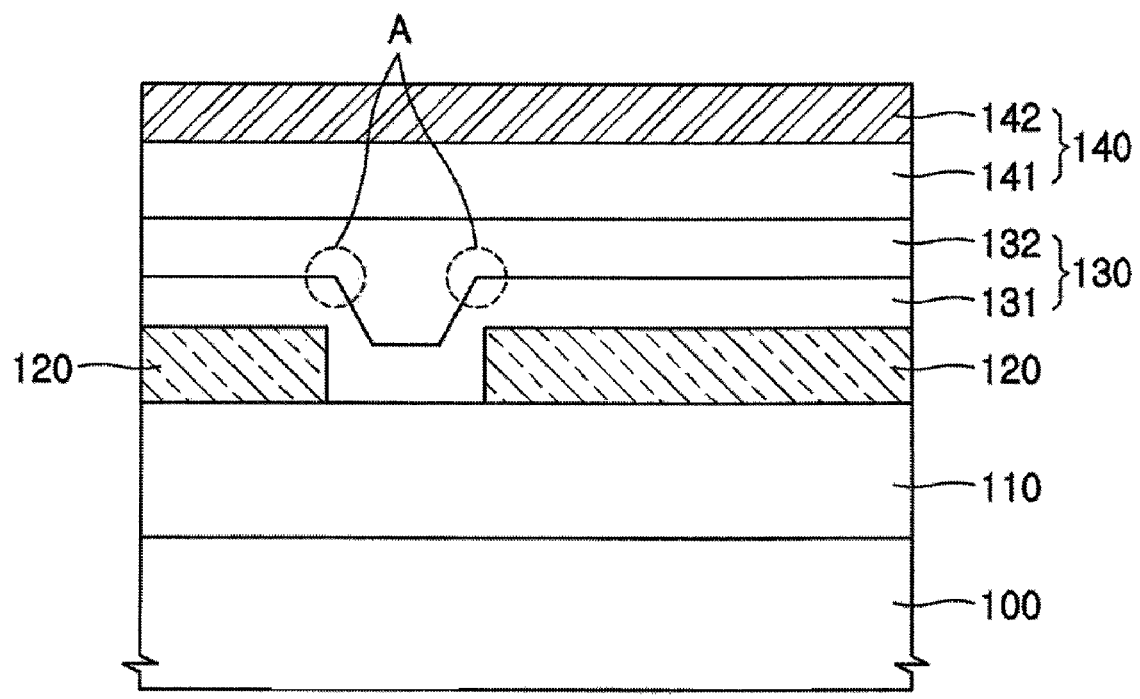
FIG. 1 is a sectional view illustrating a method of forming a metal insulating layer of a related semiconductor device and its problems.
Figure 2:
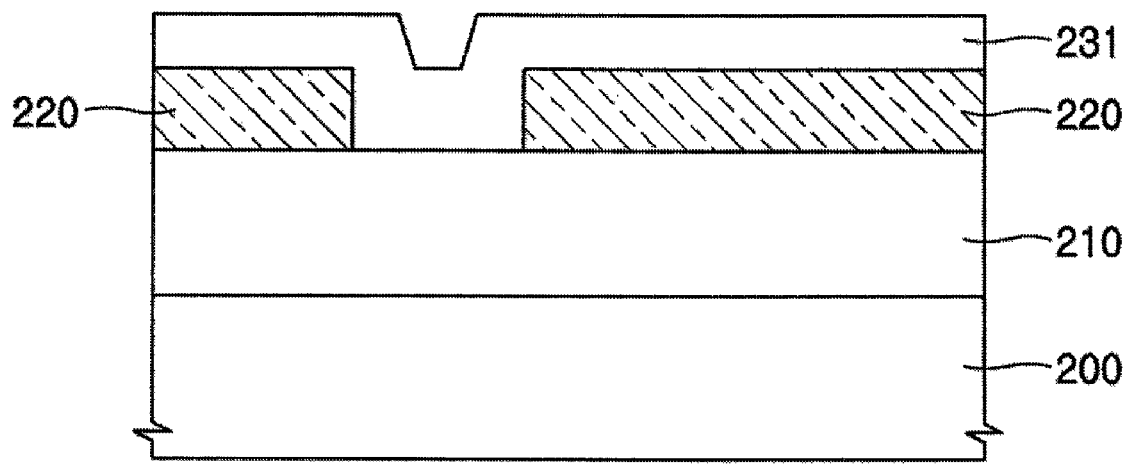
FIGS. 2 and 3 are sectional views illustrating a method of forming a metal insulating layer of a semiconductor device according to embodiments.
Figure 3:
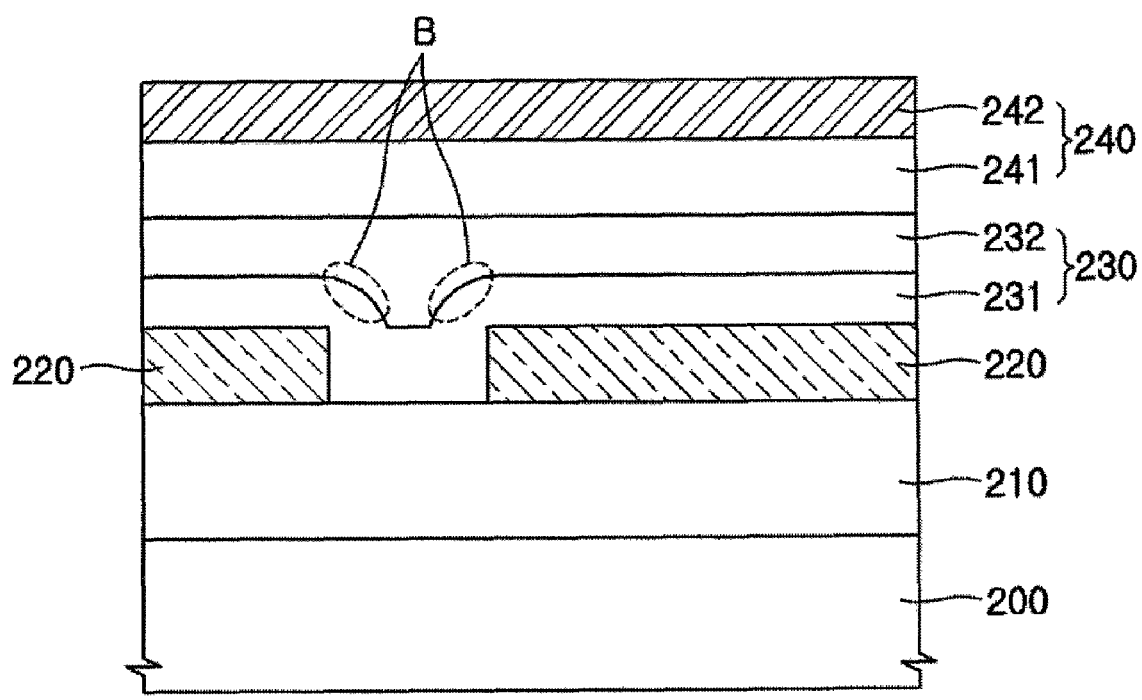

FIGS. 2 and 3 are sectional views illustrating a method of forming a metal insulating layer of a semiconductor device according to embodiments.

Referring to FIG. 2, an insulating layer 210 is formed over semiconductor substrate 200. A metal interconnection pattern 220 lies over and partially exposes a part of the surface of the insulating layer 210. A first metal insulating sub-layer 231 is formed over a metal interconnection layer pattern 220. Although not shown in the drawing, an active device and/or a passive device and a multi-layer metal interconnection can be aligned between the semiconductor substrate 200 and the metal interconnection layer pattern. The metal interconnection layer pattern 220 may be connected to an active and/or passive device and/or to the metal interconnection structure. The first metal insulating sub-layer 231 is formed of an HDP oxide layer. The HDP oxide layer performs well at filling gaps, however, it is very rigid, and has inferior flexibility. The first metal insulating sub-layer 231 formed of the HDP oxide layer is formed by repeated deposition and etching. The first metal insulating sub-layer 231 is deposited thicker than desired, so that it may be etched back to the desired thickness. Before etching, the top edges of the first metal insulating sub-layer 231 have sharp profiles due to the step difference caused by the metal interconnection layer pattern 220.

Referring to FIG. 3, the first metal insulating sub-layer 231 is wet etched to round off the top edges as denoted by B in the drawing. The first metal insulating sub-layer 231 was deposited with sufficient thickness so that, after wet etching, the top edges of the first metal insulating sub-layer 231 can have a rounded profile while leaving the first metal insulating sub-layer 231 with a desired thickness. Since the top edges of the first metal insulating sub-layer 231 have round profiles, stress due to differential thermal expansion between the metal interconnection layer pattern 220 and the insulating layers caused by subsequent thermal processes is released. As a result, it is possible to prevent the insulating layers from being cracked.

After the first metal insulating sub-layer 231 is etched, a second metal insulating sub-layer 232 is formed over the first metal insulating sub-layer 231 to form a metal insulating layer 230. The second metal insulating sub-layer 232 may be formed of a plasma enhanced-tetra ethyl ortho silicate (PE-TEO) oxide layer. Then, a protective insulating layer 240 is formed by depositing a first protective insulating layer 241 and a second protective insulating layer 242 over the metal insulating layer. The first protective insulating layer 241 can be formed of an oxide layer and the second protective insulating layer 242 can be formed of a nitride layer.

As described above, according to embodiments, after forming the HDP oxide layer as the first metal insulating sub-layer, the sharp edges of the HDP oxide layer are rounded off by wet etching. Therefore, stress due to the difference in the thermal expansion coefficient between the metal interconnection layer pattern and the insulating layers that can be caused by a subsequent thermal process is released. As a result, it is possible to prevent the insulating layers from being cracked.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of forming a metal insulating layer of a semiconductor device, the method comprising:

forming a first metal insulating sub-layer over a metal interconnection layer pattern, wherein top edges of the first metal insulating sub-layer have sharp profiles due to a step height difference in the metal interconnection layer pattern;

wet etching the first metal insulating sub-layer to round off the top edges of the first metal insulating sub-layer; and forming a second metal insulating sub-layer over the etched first metal insulating sub-layer.

2. The method of claim 1, wherein the first metal insulating sub-layer includes an HDP oxide layer.

3. The method of claim 1, wherein the second metal insulating sub-layer includes a PE-TEOS oxide layer.

4. The method of claim 1, further comprising:

forming a protective insulating layer over the second metal insulating sub-layer including an oxide layer and a nitride layer.

5. The method of claim 1, wherein the first metal insulating sub-layer is aligned over a metal interconnection layer which is formed over a lower insulating layer, which in turn is formed over a semiconductor substrate.

6. The method of claim 5, wherein the metal interconnection layer pattern has a gap formed therein exposing a portion of the lower insulating layer.

* * * * *